United States Patent
Kwon

(10) Patent No.: US 7,508,271 B2
(45) Date of Patent: Mar. 24, 2009

(54) SEMICONDUCTOR MEMORY APPARATUS HAVING PHASE LOCKED LOOP

(75) Inventor: Dae Han Kwon, Gyeonggi-do (KR)

(73) Assignee: Hynix Semiconductors Inc., Gyeonggi-do (KR)

( * ) Notice: Subject to any disclaimer, the term of this patent is extended or adjusted under 35 U.S.C. 154(b) by 152 days.

(21) Appl. No.: 11/647,480

(22) Filed: Dec. 29, 2006

(65) Prior Publication Data
US 2008/0012646 A1  Jan. 17, 2008

(30) Foreign Application Priority Data
Jun. 30, 2006 (KR) .................. 10-2006-0060489

(51) Int. Cl.
*H03L 7/07* (2006.01)
(52) U.S. Cl. .............. 331/2; 331/1 A; 331/49
(58) Field of Classification Search .......... 331/1 A, 331/2, 17, 25, 49, 172, 173
See application file for complete search history.

(56) References Cited

U.S. PATENT DOCUMENTS 5,420,544 A  5/1995 Ishibashi
5,909,149 A * 6/1999 Bath et al. .............. 331/2
6,252,444 B1  6/2001 Lee

FOREIGN PATENT DOCUMENTS

| JP | 6-204436 A | 7/1994 |
|---|---|---|
| JP | 10-270999 | 9/1998 |
| JP | 2005-98809 A | 4/2005 |
| JP | 2006-085851 | 3/2006 |
| KR | 1020000025981 | 5/2000 |

* cited by examiner

*Primary Examiner*—David Mis
(74) *Attorney, Agent, or Firm*—Venable LLP; Jeffri A. Kaminski

(57) ABSTRACT

A semiconductor memory apparatus includes a PLL selector that selectively activates a plurality of PLL enable signals by decoding pluralities of PLL selection signals, and a plurality of PLL circuits that connect to a plurality of PLL enable signals respectively, wherein when the one of a plurality of PLL enable signals is activated, the PLL circuit connected the activated PLL enable signal is operated to execute phase locking operations.

13 Claims, 2 Drawing Sheets

SEMICONDUCTOR MEMORY APPARATUS HAVING PHASE LOCKED LOOP

CROSS-REFERENCE TO RELATED APPLICATIONS

This U.S. non-provisional patent application claims priority under 35 U.S.C. § 119 of Korean Patent Application No. 10-2006-0060489 filed on Jun. 30, 2006, the entire contents of which are hereby incorporated by reference.

BACKGROUND

The present invention relates to semiconductor memory apparatuses and more particularly, to a semiconductor memory apparatus employing a phase locked loop (PLL) selectively operable in accordance with frequency band.

A known semiconductor apparatus includes a delay locked loop (DLL) circuit to provide an internal clock that precedes a reference clock in a phase by a predetermined amount of time, where the reference clock is obtained by transforming an external clock. The internal clock is usually generated to enable operations in sync with an external clock in a high-density semiconductor memory apparatus such as a synchronous DRAM.

With the trend toward high frequency operation for semiconductor memory apparatuses, the clock frequency of external clocks, as well as the corresponding internal clocks, increases. Thereby, a semiconductor memory apparatus using a conventional DLL circuit becomes unstable in operations of inputting and outputting data in sync with a clock. This is especially true for some semiconductor memory devices used in graphics processes, where data input/output operations become less reliable because of decreasing margins in operational timings between data strobe signals and data.

To alleviate this problem, a semiconductor memory apparatus operating at high frequency is usually associated with a PLL circuit for stabilizing its data input/output operations. A semiconductor memory apparatus employing a PLL circuit for data input does not need to conduct an operation for generating data strobe signals from a clock and latching data. Such a semiconductor memory apparatus including the PLL circuit is used to detect a phase difference between the operational timing of the clock and one of the data and then synchronize the clock and the data by controlling the phase of the data. Therefore, such a semiconductor memory apparatus including the PLL circuit enhances the reliability of the data input operation.

However, such a conventional PLL circuit is only operable in narrow frequency bandwidths. In practice, there is no limit as to the frequency bandwidth in a semiconductor memory apparatus and the signals internally operating therein are modifiable in frequency in accordance with variations of process, voltage, and temperature (PVT).

As such, a PLL circuit operable in only narrow frequency bandwidths is very restrictive and acts as a technical limitation to a semiconductor memory apparatus.

SUMMARY OF THE INVENTION

The present invention provides a semiconductor memory apparatus employing PLL circuits operable regardless of the frequency bandwidth.

An embodiment of the present invention provides a semiconductor memory apparatus including a PLL selector that decodes a plurality of PLL selection signals and selectively activates a plurality of PLL enable signals and a plurality of PLL circuits that connect to a plurality of PLL enable signals respectively, wherein, when the one of a plurality of PLL enable signals is activated, the PLL circuit connected the activated PLL enable signal is operated to execute phase locking operations.

Another embodiment of the present invention provides a semiconductor memory apparatus including a plurality of PLL circuits respective to available frequency bandwidths, and a PLL selector activating one of the plurality of PLL circuits in accordance with an input providing information about the available frequency bandwidth.

A further understanding of the nature and advantages of the present invention herein may be realized by reference to the remaining portion of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION OF PREFERRED EMBODIMENTS

Figure 1:
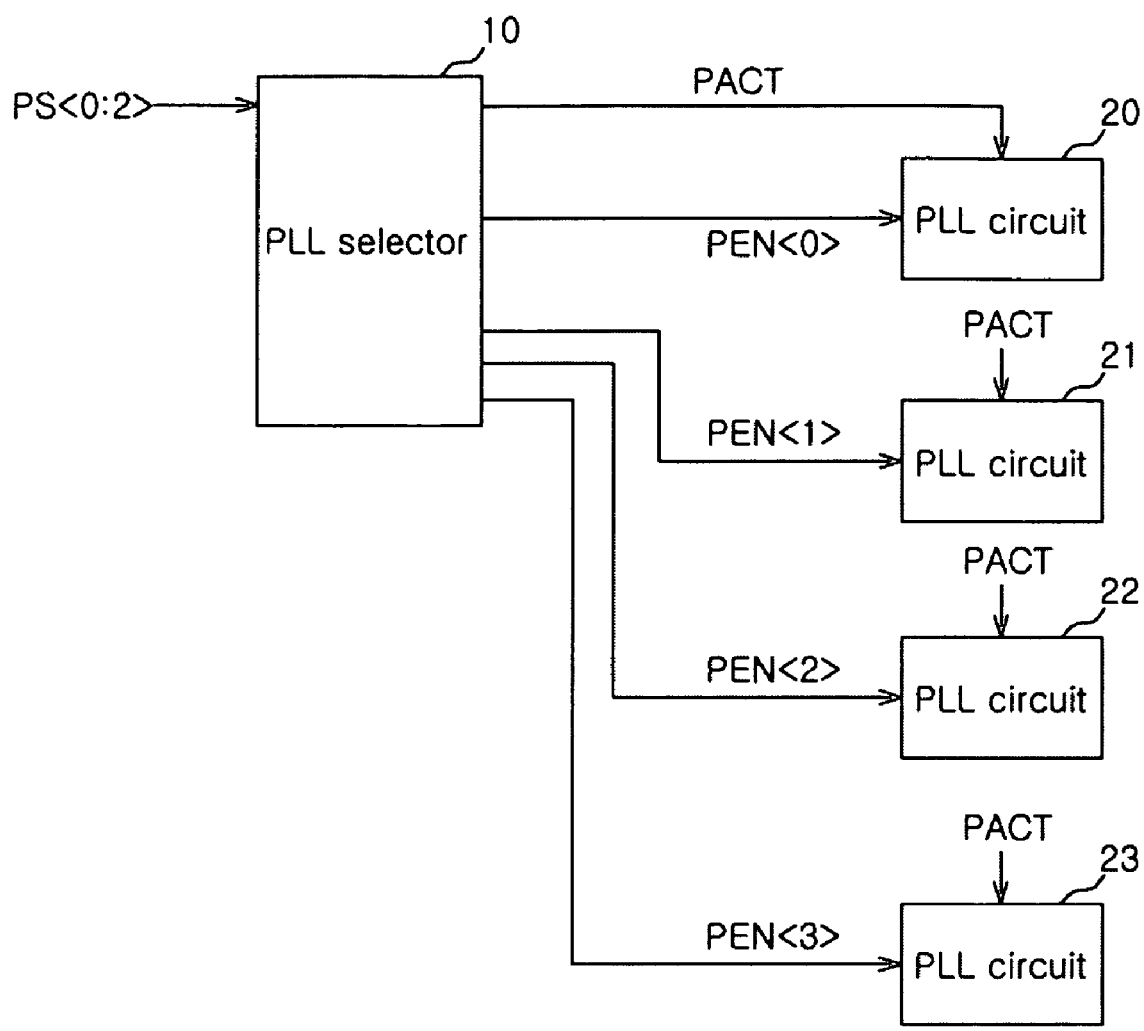
FIG. 1 is a block diagram illustrating a PLL selection circuit of a semiconductor memory apparatus in accordance with the present invention.

Preferred embodiments of the present invention are described below in more detail with reference to the accompanying drawings. The present invention may, however, be embodied in different forms and should not be construed as being limited to the embodiments set forth herein. Rather, these embodiments are provided for the sake of completeness and to fully convey the scope of the present invention to those skilled in the art. Like reference numerals refer to like elements throughout the accompanying figures.

FIG. 1 is a block diagram illustrating a PLL selection circuit of a semiconductor memory apparatus in accordance with the present invention, exemplarily showing the PLL selection circuit operable with three PLL selection signals and equipped with four PLL circuits. But, the present invention is not limited to that shown in FIG. 1. The PLL circuit of the present invention may be otherwise implemented in the form of mode register set (MRS) circuit.

Referring to FIG. 1, the PLL selection circuit includes a PLL selector 10 that selectively activates a PLL mode signal PACT and four PLL enable signals PEN<0:3> by decoding three PLL selection signals PS<0:2>, and four PLL circuits 20~23 that execute a phase locking operation for data in response to activation of the PLL enable signal PEN<i> (i=0, 1, 2, or 3) corresponding thereto.

The PLL selection signal PS<0> of the three PLL selection signals PS<0:2> is provided to define the PLL operation mode of the semiconductor memory apparatus. Namely, when the PLL selection signal PS<0> is at a low level, the semiconductor memory apparatus does not use the PLL circuits. During this time, the four PLL circuits 20~23 are all deactivated. Otherwise, when the PLL selection signal PS<0> is at a high level, the semiconductor memory apparatus uses the PLL circuits. During this time, one of the four PLL circuits 20~23 is activated.

The PLL selection signals PS<1> and PS<2> contain information about available frequency bandwidths in accordance with their values and selectively activate the four PLL enable signals PEN<0:3>. For instance, the PLL selection signals PS<1> and PS<2> transfer information about variable frequency bandwidths in logical values such that: (0,0) corresponds to 250~500 MHz; (0,1) corresponds to 500~750 MHz; (1,0) corresponds to 750~1000 MHz; and (1,1) corresponds to 1~1.25 GHz.

Corresponding respectively to the variable frequency bandwidths, the four enable signals PEN<0:3> are selectively activated and each of the PLL circuits 20~23 begins to execute the phase locking operation for data in response to each activation of the PLL enable signal PEN<i>.

Figure 2:
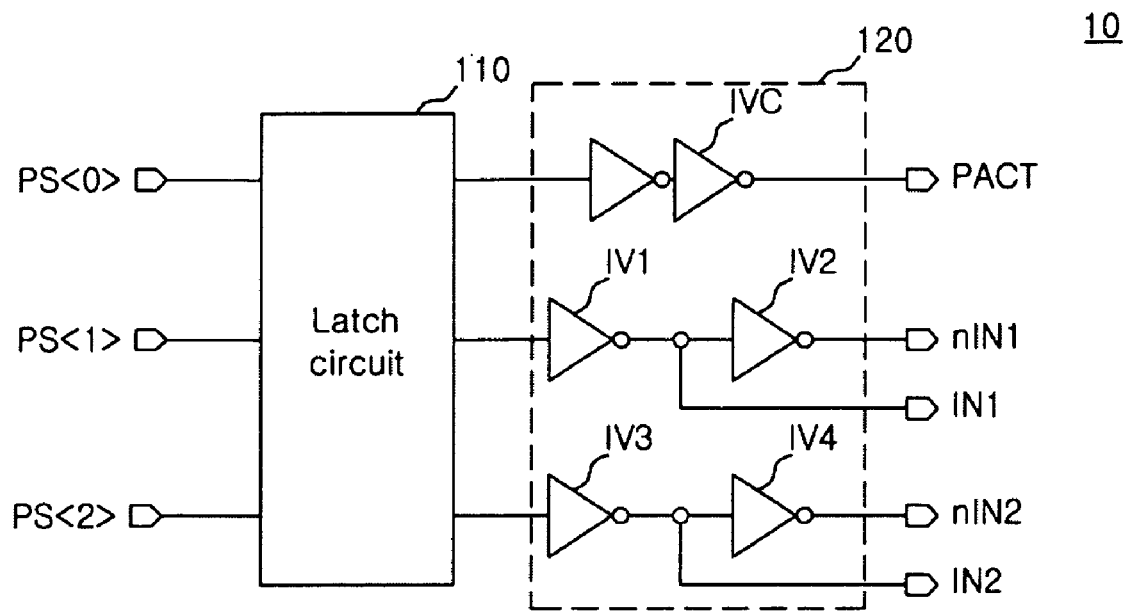
FIG. 2 is a circuit diagram illustrating an embodiment of the PLL selector shown in FIG. 1.
Figure 2:
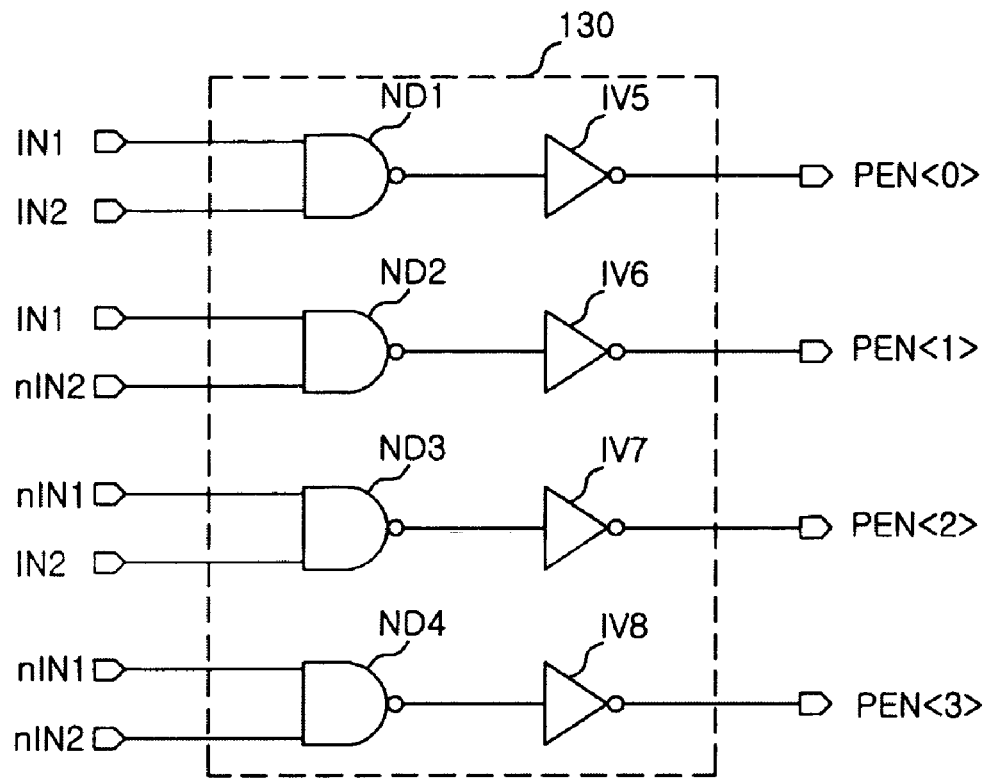

FIG. 2 is a circuit diagram illustrating an embodiment of the PLL selector shown in FIG. 1.

Referring to FIG. 2, the PLL selector 10 includes a latch circuit 110, a signal generator 120, and a signal combiner 130. The latch circuit 110 holds the three PLL selection signals PS<0:2>. The signal generator 120 operates to generate the PLL mode signal PACT, a first inverted signal IN1, a first non-inverted signal nIN1, a second inverted signal IN2, and a second non-inverted signal nIN2 from the signals held in the latch circuit 110. The signal combiner 130 generates the four PLL enable signals PEN<0:3> by combining the first inverted signal IN1, the first non-inverted signal nIN1, the second inverted signal IN2, and the second non-inverted signal nIN2.

The signal generator 120 includes an inverter chain IVC, a first inverter IV1, a second inverter IV2, a third inverter IV3, and a fourth inverter IV4. The inverter chain IVC outputs the PLL mode signal PACT by non-inversely driving the PLL selection signal PS<0>. The first inverter IV1 generates the first inverted signal IN1 by inverting the PLL selection signal PS<1> output from the latch circuit 110. The second inverter IV2 outputs the first non-inverted signal nIN1 by inverting the first inverted signal IN1. The third inverter IV3 generates the second inverted signal IN2 by inverting the PLL selection signal PS<2> output from the latch circuit 110. The fourth inverter IV2 outputs the second non-inverted signal nIN2 by inverting the second inverted signal IN2.

The signal combiner 130 includes: a first NAND gate ND1 that receives the first inverted signal IN1 and the second inverted signal IN2; a fifth inverter IV5 that outputs the PLL enable signal PEN<0> by inverting an output signal of the first NAND gate ND1; a second NAND gate ND2 that receives the first inverted signal IN1 and the second non-inverted signal nIN2; a sixth inverter IV6 that outputs the PLL enable signal PEN<1> by inverting an output signal of the second NAND gate ND2; a third NAND gate ND3 that receives the first non-inverted signal nIN1 and the second inverted signal IN2; a seventh inverter IV7 that outputs the PLL enable signal PEN<2> by inverting an output signal of the third NAND gate ND3; a fourth NAND gate ND4 that receives the first non-inverted signal nIN1 and the second non-inverted signal nIN2; and an eighth inverter IV8 that outputs the PLL enable signal PEN<3> by inverting an output signal of the fourth NAND gate ND4.

The semiconductor memory apparatus having the PLL selector 10 enters the PLL operation mode when the PLL selection signal PS<0> becomes high level. After that, when the PLL selection signals PS<1> and PS<2> are set to the logical value (0,0), the first and second inverted signals IN1 and IN2 go to high levels and the first and second non-inverted signals nIN1 and nIN2 go to low levels. Thereby, the PLL enable signal PEN<0> is activated.

When the PLL selection signals PS<1> and PS<2> are set to the logic value (0,1), the first inverted signal IN1 and the second non-inverted signal nIN2 go to high levels and the first non-inverted signal nIN1 and the second inverted signal IN2 go to low levels. Thereby, the PLL enable signal PEN<1> is activated.

When the PLL selection signals PS<1> and PS<2> are set to the logic value (1,0), the first non-inverted signal nIN1 and the second inverted signals IN2 go to high levels and the first inverted signal IN1 and the second non-inverted signal nIN2 go to low levels. Thereby, the PLL enable signal PEN<2> is activated.

When the PLL selection signals PS<1> and PS<2> are set to the logical value (1,1), the first and second non-inverted signals nIN1 and nIN2 go to high levels and the first and second inverted signals IN1 and IN2 go to low levels. Thereby, the PLL enable signal PEN<3> is activated.

As such, a plurality of PLL circuits is selectively operated by generating a plurality of PLL enable signals and PLL mode signal for setting the PLL operation mode. A plurality of PLL enable signals and the PLL mode signal are generating by decoding a plurality of PLL selection signals. Accordingly, it is no longer necessary to operate within a narrow frequency bandwidth of a single PLL circuit. The number of a PLL circuits may be properly adjusted in accordance with available frequency bandwidth that a PLL circuit has and the entire frequency bandwidth usable in the semiconductor memory apparatus. Therefore, the semiconductor memory apparatus is operable with a wider frequency bandwidth by using the PLL circuits, easily implementing a more advanced high-frequency semiconductor memory apparatus.

As described above, the semiconductor memory apparatus according to the present invention efficiently utilizes PLL circuits regardless of frequency bandwidths by selectively activating the PLL circuits in accordance with the PLL selection signals.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor memory apparatus comprising:
   a PLL selector configured to selectively activate a plurality of PLL enable signals formed by decoding a plurality of PLL selection signals; and
   a plurality of PLL circuits configured to be connected to the plurality of PLL enable signals respectively, wherein when one of the plurality of PLL enable signals is activated, the PLL circuit connected to the activated PLL enable signal executes phase locking operations.

2. The semiconductor memory apparatus as set forth in claim 1, wherein each of the plurality of PLL circuits has an available frequency bandwidth.

3. The semiconductor memory apparatus as set forth in claim 1, wherein the PLL selector is an MRS circuit.

4. The semiconductor memory apparatus as set forth in claim 1, wherein the PLL selector includes:
   a latch circuit configured to sequentially hold the plural PLL selection signals;
   a signal generator configured to generate a PLL mode signal, a first inverted signal, a first non-inverted signal, a second inverted signal, and a second non-inverted signal from signals held in the latch circuit; and a signal combiner configured to generate the plural PLL enable signals by combining the first inverted signal, the first non-inverted signal, the second inverted signal, and the second non-inverted signal.

5. The semiconductor memory apparatus as set forth in claim 4, wherein the signal generator comprises:
an inverter chain configured to generate the PLL mode signal by non-inversely driving a first signal output from the latch circuit;
a first inverter configured to generate the first inverted signal by inverting a second signal output from the latch circuit;
a second inverter configured to generate the first non-inverted signal by inverting the first inverted signal;
a third inverter configured to generate the second inverted signal by inverting a third signal output from the latch circuit; and
a fourth inverter configured to generate the second non-inverted signal by inverting the second inverted signal.

6. The semiconductor memory apparatus as set forth in claim 4, wherein the signal combiner comprises:
a first NAND gate inputs configured to receive the first inverted signal and the second inverted signal and to produce an output signal;
a first inverter configured to output a first PLL enable signal by inverting the output signal of the first NAND gate;
a second NAND gate configured to receive the first inverted signal and the second non-inverted signal to produce an output signal;
a second inverter configured to output a second PLL enable signal by inverting the output signal of the second NAND gate;
a third NAND gate configured to receive the first non-inverted signal and the second inverted signal to produce an output signal;
a third inverter configured to output a third PLL enable signal by inverting the output signal of the third NAND gate;
a fourth NAND gate configured to receive the first non-inverted signal and the second non-inverted signal to produce an output signal; and
an fourth inverter configured to output a fourth PLL enable signal by inverting the output signal of the fourth NAND gate.

7. A semiconductor memory apparatus comprising:
a plurality of PLL circuits that respectively have available frequency bandwidths; and
a PLL selector having an input configured to receive at least one PLL selection signal, wherein the PLL selector is configured to generate a plurality of PLL enable signals for activating the plurality of PLL circuits and activate one of the plurality of PLL enable signals for activating one of the plurality of PLL circuits using the PLL selection signal, and the PLL selection signal includes information about the frequency bandwidth.

8. The semiconductor memory apparatus as set forth in claim 7, wherein the PLL selector is an MRS circuit.

9. The semiconductor memory apparatus as set forth in claim 7, wherein the PLL selector comprises:
a latch circuit configured to hold the PLL selection signal;

a signal generator configured to generate a PLL mode signal, a first inverted signal, a first non-inverted signal, a second inverted signal, and a second non-inverted signal from signals held in the latch circuit; and
a signal combiner configured to generate the PLL enable signals by combining the first inverted signal, the first non-inverted signal, the second inverted signal, and the second non-inverted signal.

10. The semiconductor memory apparatus as set forth in claim 9, wherein the signal generator comprises:
an inverter chain configured to generate the PLL mode signal by non-inversely driving a first signal output from the latch circuit;
a first inverter configured to generate the first inverted signal by inverting a second signal output from the latch circuit;
a second inverter configured to generate the first non-inverted signal by inverting the first inverted signal;
a third inverter configured to generate the second inverted signal by inverting the third signal output from the latch circuit; and
a fourth inverter configured to generate the second non-inverted signal by inverting the second inverted signal.

11. The semiconductor memory apparatus as set forth in claim 9, wherein the signal combiner includes:
a first NAND gate configured to receive the first inverted signal and the second inverted signal to produce an output signal;
a first inverter configured to output a first PLL enable signal by inverting the output signal of the first NAND gate;
a second NAND gate configured to receive the first inverted signal and the second non-inverted signal to produce an output signal;
a second inverter configured to output a second PLL enable signal by inverting the output signal of the second NAND gate;
a third NAND gate configured to receive the first non-inverted signal and the second inverted signal to produce an output signal;
a third inverter output a third PLL enable signal by inverting the output signal of the third NAND gate;
a fourth NAND gate configured to receive the first non-inverted signal and the second non-inverted signal to produce an output signal; and
an fourth inverter configured to output a fourth PLL enable signal by inverting the output signal of the fourth NAND gate.

12. A semiconductor memory apparatus comprising:
a first PLL circuit configured to operate in a first frequency bandwidth;
a second PLL circuit configured to operate in a second frequency bandwidth; and
a PLL selector configured to generate a PLL enable signal for activating one of the first and second PLL circuits in response to the PLL selection signal, wherein the PLL selection signal includes information about the first and second frequency bandwidth.

13. The semiconductor memory apparatus as set forth in claim 12, wherein the PLL selector is an MRS circuit.

* * * * *